US012152647B2

(12) United States Patent
Brown et al.

(10) Patent No.: US 12,152,647 B2
(45) Date of Patent: Nov. 26, 2024

(54) CUSTOMIZED FOAM STRUCTURES

(71) Applicant: Hamilton Sundstrand Corporation, Charlotte, NC (US)

(72) Inventors: Ricardo O. Brown, West Hartford, CT (US); Travis H. Marshall, West Hartford, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 660 days.

(21) Appl. No.: 17/360,856

(22) Filed: Jun. 28, 2021

(65) Prior Publication Data
US 2022/0412421 A1    Dec. 29, 2022

(51) Int. Cl.
*F16F 1/37*    (2006.01)
*F16F 15/08*    (2006.01)
*H05K 7/14*    (2006.01)

(52) U.S. Cl.
CPC .............. *F16F 1/37* (2013.01); *F16F 15/08* (2013.01); *H05K 7/1488* (2013.01); *F16F 2224/0225* (2013.01); *F16F 2226/04* (2013.01)

(58) Field of Classification Search
CPC ...... H05K 7/1488; H05K 9/00; H05K 9/0015; F16F 1/37; F16F 15/08; B33Y 80/00; B32B 5/12; B32B 5/26

USPC .................. 361/800, 816, 818; 174/350; 257/660–690
See application file for complete search history.

(56) References Cited

U.S. PATENT DOCUMENTS

| | | | |
|---|---|---|---|
| 2009/0035510 A1* | 2/2009 | Chakrabarti | E04C 2/3405 428/116 |
| 2011/0256356 A1* | 10/2011 | Tomantschger | C25D 5/10 977/734 |
| 2013/0203878 A1* | 8/2013 | Igualada | C08J 9/142 521/88 |
| 2014/0033411 A1* | 2/2014 | Kisailus | B32B 5/12 428/113 |
| 2016/0262291 A1* | 9/2016 | Tucker | H05K 9/0015 |
| 2020/0231020 A1* | 7/2020 | Kim | A47J 39/003 |
| 2021/0093090 A1* | 4/2021 | Deevers | B33Y 80/00 |

* cited by examiner

*Primary Examiner* — Tuan T Dinh
(74) *Attorney, Agent, or Firm* — Bachman & LaPointe, P.C.

(57) ABSTRACT

A shock resistant body comprises a non-metallic lattice structure having a first region with a first foam density in a first region and a second foam density in a second region that is lower from the first foam density. The first region has solid lattice members of a larger cross-sectional area than those in the second region and the first region has smaller interstices between solid lattice members than those in the second region.

7 Claims, 6 Drawing Sheets

CUSTOMIZED FOAM STRUCTURES

BACKGROUND

1. Field

This disclosure relates generally to foam materials, and more particularly to foam materials such as those used to provide support for impact resistance.

2. Description of Related Art

Foams can be used for shock resistance against impact, vibration, and deflection in aerospace and similar applications. Such foams are fabricated by chemical reactions or physical mixtures, such as bubbles in resin, to create voids in the foam. The foam has a uniform cell density and can be cut to create a custom geometry for its given application.

The conventional techniques have been considered satisfactory for their intended purpose. However, there is an ever present need for improved systems and methods for reduced weight of foam components, e.g. for shock absorbing electronics components, while potentially increasing compression strength of those components. This disclosure provides a solution for this need.

SUMMARY

A shock resistant body comprises a non-metallic lattice structure having a first foam density in a first region and a second foam density in second region that is lower than the first foam density. The first region can have solid lattice members of a larger cross-sectional area than solid lattice members in the second region and the first region can have smaller interstices between solid lattice members than between solid lattice members in the second region.

In embodiments, the first region can have a constant foam density, and the second region can have a constant foam density and a transition region is defined between the first and second regions. The transition region can have a foam density that transitions from the first foam density to the second foam density in a direction from the first region to the second region forming a density gradient. In certain embodiments, the first region and the second region are among a plurality of regions and the lattice structure has a continuously variable foam density across the plurality of regions. In certain embodiments, the lattice structure has a staged foam density across the plurality of regions.

In embodiments, the lattice structure can be of one or more materials selected from the list containing: silicone, urethane, rubber. The non-metallic lattice structure can be a product by process. The process can be one or more processes selected from the list consisting of material extrusion, fused filament fabrication, fused deposition modeling, selective laser sintering, multi-jet fusion, vat polymerization, stereolithography, digital light synthesis, and material jetting.

In embodiments, the body can include a plurality of apertures defined in the body configured to convey a cooling fluid therethrough, where the body is sized to accommodate a plurality of cooling fans in an electronics cabinet.

In accordance with another aspect of this disclosure, an electronics assembly can include an electronics cabinet configured to house a plurality of flex boards and an additively manufactured electronics card spacer configured to assemble to a respective flex board to provide stiffness to the flex board. The electronics card spacer can include a spacer body spacer having a first portion having a first foam density, a second portion having a second foam density, a bridge having a third foam density and connecting between the first portion and the second portion, and at least one transition region having a fourth foam density defined between the first portion and the bridge and between the bridge and the second portion.

The third foam density can be greater than the first and second foam densities, can the fourth foam density can be less than the third foam density but greater than the first and second foam densities. In embodiments, the first and second portions can have solid lattice members of a smaller cross-sectional area than solid lattice members in the bridge. In embodiments, the first and second portions can have larger interstices between solid lattice members than between solid lattice members in the bridge. In certain embodiments, the foam density of the electronics card spacer can have a continuously variable foam density across the regions and bridge. In certain embodiments, the foam density of the electronics card spacer can have a staged foam density across the regions and bridge.

In embodiments, each of the first portion, second portion, and bridge can have a constant respective foam density. The fourth foam density of the transition region can transition from the first foam density to the third foam density in a direction from the first portion to the bridge forming a first density gradient, and from the third foam density to the second foam density in a direction from the bridge to the second portion forming a second density gradient.

In embodiments, the first portion, second portion, and bridge can form a single continuous monolithic, integral structure. In certain embodiments, a plurality of apertures can be defined in at least one of the first portion and/or second portion configured to mount the electronics card spacer to the flex boards. The electronics card spacer can be inserted into the electronics cabinet configured to provide shock absorption to electronics seated within the electronics cabinet.

In accordance with another aspect of this disclosure, an electronics assembly can include an electronics chassis and an additively manufactured electronics card guide configured to retain a plurality of electronics cards in the electronics chassis. The electronics card guide can include a first end region having a first foam density, a second end region having a second foam density, a plurality of spacer regions having a third foam density, the spacer regions being between the first and second end regions, a plurality of electronics card slots having a fourth foam density, the electronics card slots being between the first and second end regions and alternating with the spacer regions along a length of the electronics card guide, and a plurality of transition regions having a fifth foam density, wherein the fourth foam density is greater than the first, second, and third foam densities, and wherein the fifth foam density is greater than the first, second, and third foam densities but less than the fourth foam density.

The electronics card slots can have solid lattice members of a larger cross-sectional area than solid lattice members in the first and second end regions and in the spacer regions, and the electronics card slots can have smaller interstices between solid lattice members than between solid lattice members in the first and second end regions and in the spacer regions. In embodiments, each of the first end region, the second end region, the spacer region, and the electronics card slots can have a constant respective foam density. The transition region can have a foam density that transitions from the first foam density to the fourth foam density, from the fourth foam density to the third foam density, and from the third foam density to the second foam density in a lateral direction along an axial length of the electronics card guide, forming a density gradient in the transition region between each foam density. In certain embodiments, the foam density of the electronics card guide can have a continuously variable foam density across the regions and electronics card slots. In certain embodiments, the foam density of the electronics card guide can have a staged foam density across the regions and electronics card slots.

In embodiments, the first region, the second region, the spacer regions, the electronics card slot, and the transition region can form a single continuous monolithic, integral structure. The electronics card guide can be a product by process, wherein the process includes one or more processes selected from the list consisting of material extrusion (fused filament fabrication, fused deposition modeling), laser sintering (selective laser sintering, multi-jet fusion), vat polymerization (stereolithography, digital light synthesis), and material jetting.

The electronics chassis can be inserted into the electronics cabinet such that the electronics card spacer is configured to provide shock absorption to electronics cards seated within the electronics cards slots within the electronics cabinet. A plurality of apertures defined can be at least one of the first end region, the second end region and/or the spacer regions configured to mount the electronics cards to the electronics chassis and electronics cabinet.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
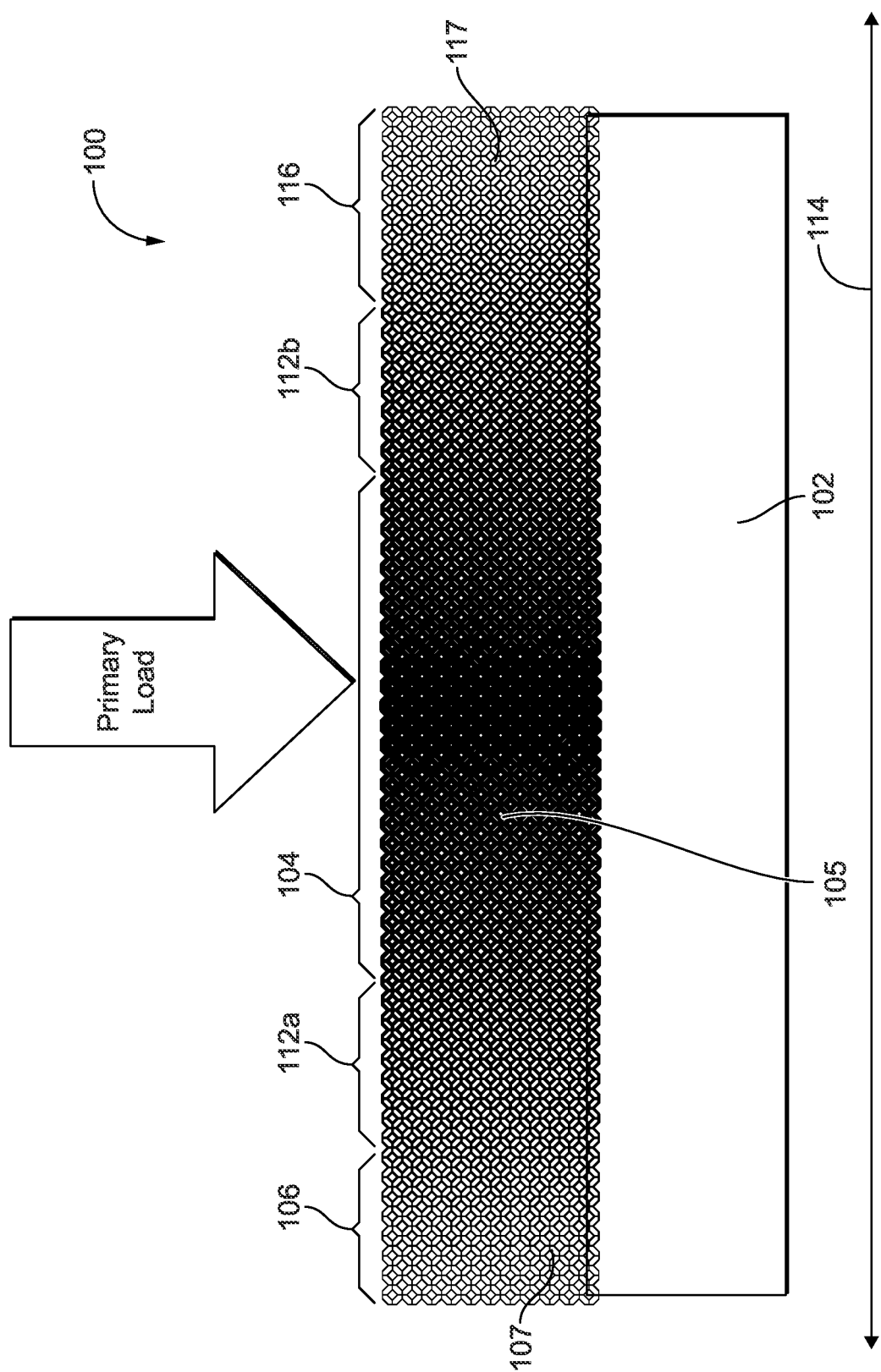
FIG. 1 is a schematic side elevation view of an embodiment of a shock resistant body constructed in accordance with the present disclosure, showing a foam like lattice structure.

Reference will now be made to the drawings wherein like reference numerals identify similar structural features or aspects of the subject disclosure. For purposes of explanation and illustration, and not limitation, a partial view of an embodiment of a body in accordance with the disclosure is shown in FIG. 1 and is designated generally by reference character 100. Other embodiments of systems in accordance with the disclosure, or aspects thereof, are provided in FIGS. 2-7, as will be described. The systems and methods described herein can be used to provide improved shock absorption to electronics components.

As shown in FIG. 1, a shock resistant body 100, for example, for absorbing shock between components (e.g. between electronics in an electronics cabinet, or between the electronics and the cabinet) can be additively manufactured in a manner that produces a foam-like structure. The shock resistance of the body 100 can be different for different materials and determined by known deflection constants for a respective material used. For example, the body 100 can comprise a lattice structure additively manufactured on a build plate 102 using any suitable additive manufacture process, including, but not limited to at least one of, material extrusion, fused filament fabrication, fused deposition modeling, selective laser sintering, multi-jet fusion, vat polymerization, stereolithography, digital light synthesis, and material jetting. The shock resistant material used to form the body 100 can include at least one of a thermoplastic or thermoset, such as silicone, urethane, epoxies, rubber, polyetherimide (PEI), polyether ether ketone (PEEK), polyetherketoneketone (PEKK), and the like, or any other suitable material having spring back properties.

Figure 2:
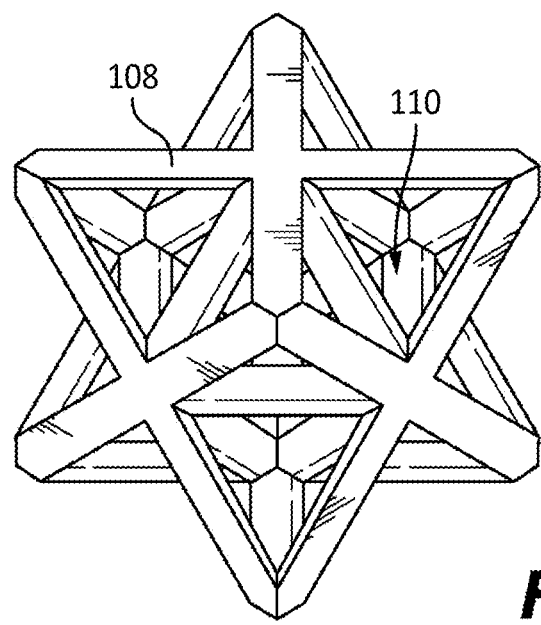
FIG. 2 is an enlarged view of a portion of the lattice structure of FIG. 1.

In embodiments, such as shown in FIG. 1, the body 100 includes a non-metallic lattice structure having a first region 104 with a first foam density 105 and a second region 106 with a second foam density 107, where the second foam density is lower from the first foam density. The lattice can include, but is not limited to, an octet-truss lattice structure such as shown in FIG. 2 (e.g. as described in Ling, Chen & Cernicchi, Alessandro & Gilchrist, Michael & Cardiff, Philip. (2018). Mechanical behaviour of additively-manufactured polymeric octet-truss lattice structures under quasi-static and dynamic compressive loading. Materials & Design. 162. 10.1016/j.matdes.2018.11.035, the entire content of which is incorporated herein by reference), or any other suitable custom lattice structure that allows for variation of cell density across the electronics cabinet varying deflection when shock is applied.

In certain embodiments, as shown in FIG. 1, the first region 104 can have solid lattice members 108 of a larger cross-sectional area than those in the second region 106 and the first region 104 can have smaller interstices 110 between solid lattice members 108 than those in the second region 106 such that the first region 104 provides more stiffness, while the second region 106 provides more flexibility.

As shown, the first region 104 can have a constant foam density within itself, and the second region 106 can have a constant foam density within itself, while at least one transition region 112 is defined between the first and second region 104, 106. The transition region 112 has a foam density that transitions from the first foam density 105 to the second foam density 107 in a direction 114 from the first region 104 to the second 106 region forming a density gradient. Additional transition regions may be included as needed when moving from one foam density to another. For example, as shown in FIG. 1, a transition region 112a exists between the first and second regions 104, 106, and a second transition region 112b exists between the first region 104 and a third region 116 having a foam density 117 different than the first foam density 105.

In certain embodiments, such as shown, the first region 104 and the second region 106 can be among a plurality of regions, and the body 100 can have a staged foam density across the plurality of regions, for example, distinct regions having a constant foam density therein. In certain embodiments, the body 100 can have a continuously variable foam density across the plurality of regions, where each region has a variable foam density therein.

Figure 3:
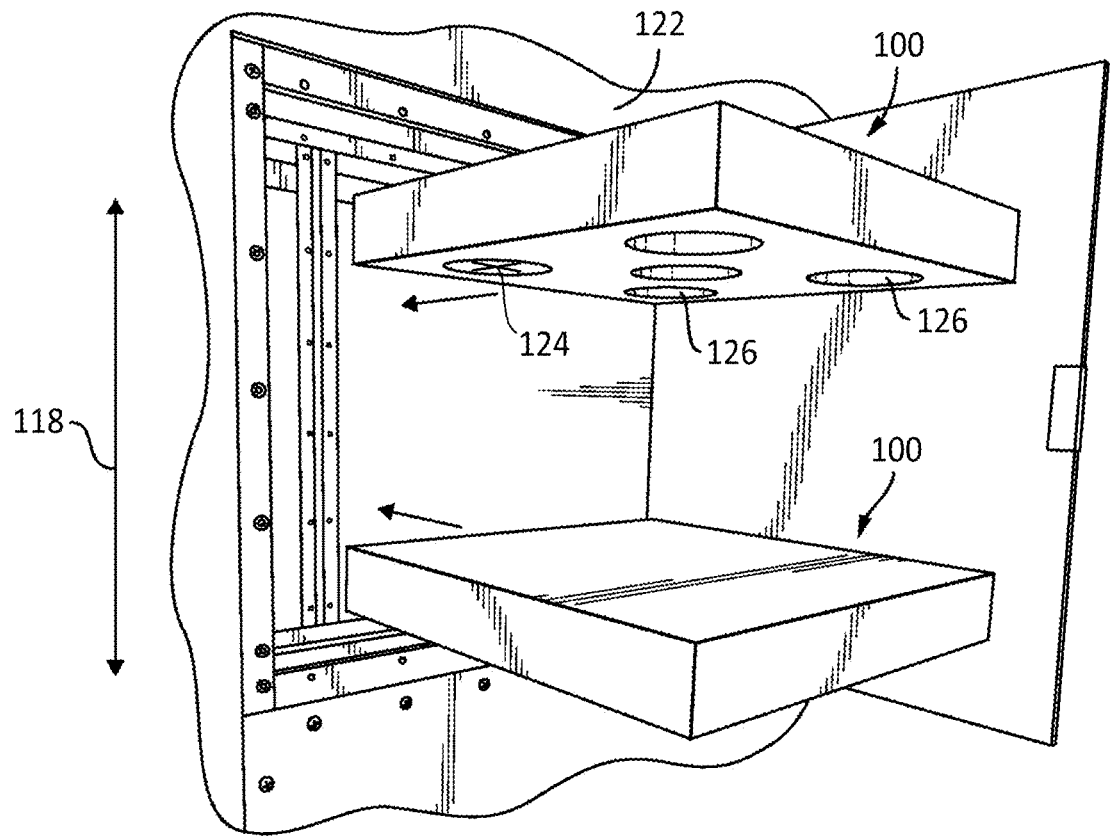
FIG. 3 is a schematic perspective view of an electronics cabinet having an embodiment of the shock resistant body of FIG. 1 disposed therein.

In certain embodiments, such as shown in FIG. 3, the body 100 can be configured to provide shock absorption with respect to vertical forces 118 applied to a plurality of electronics components 120 within an electronics cabinet 122. In certain instances, the electronics cabinet 122 may include a number of fans 124 to provide cooling to the components 120 within the cabinet 122. Conventional foam, or other shock absorbing techniques failed to provide adequate shock absorption due to void space left for the fans 124, as well as having low stiffness and high deflection. The custom body 100 as described herein can be designed and sized to provide additional support around the fans 124 (e.g. through a plurality of apertures 126, while varying the foam density around the apertures 126 to provide additional stiffness to the body 100, without compromising airflow. The body as shown in FIG. 3 may have the same lattice design as shown in FIG. 1, or may have a different lattice design. For example, the body of FIG. 4 can have any suitable number and/or arrangement of foam densities as needed to accommodate the apertures 126 and provide the requisite absorption properties for this application.

Figure 4:
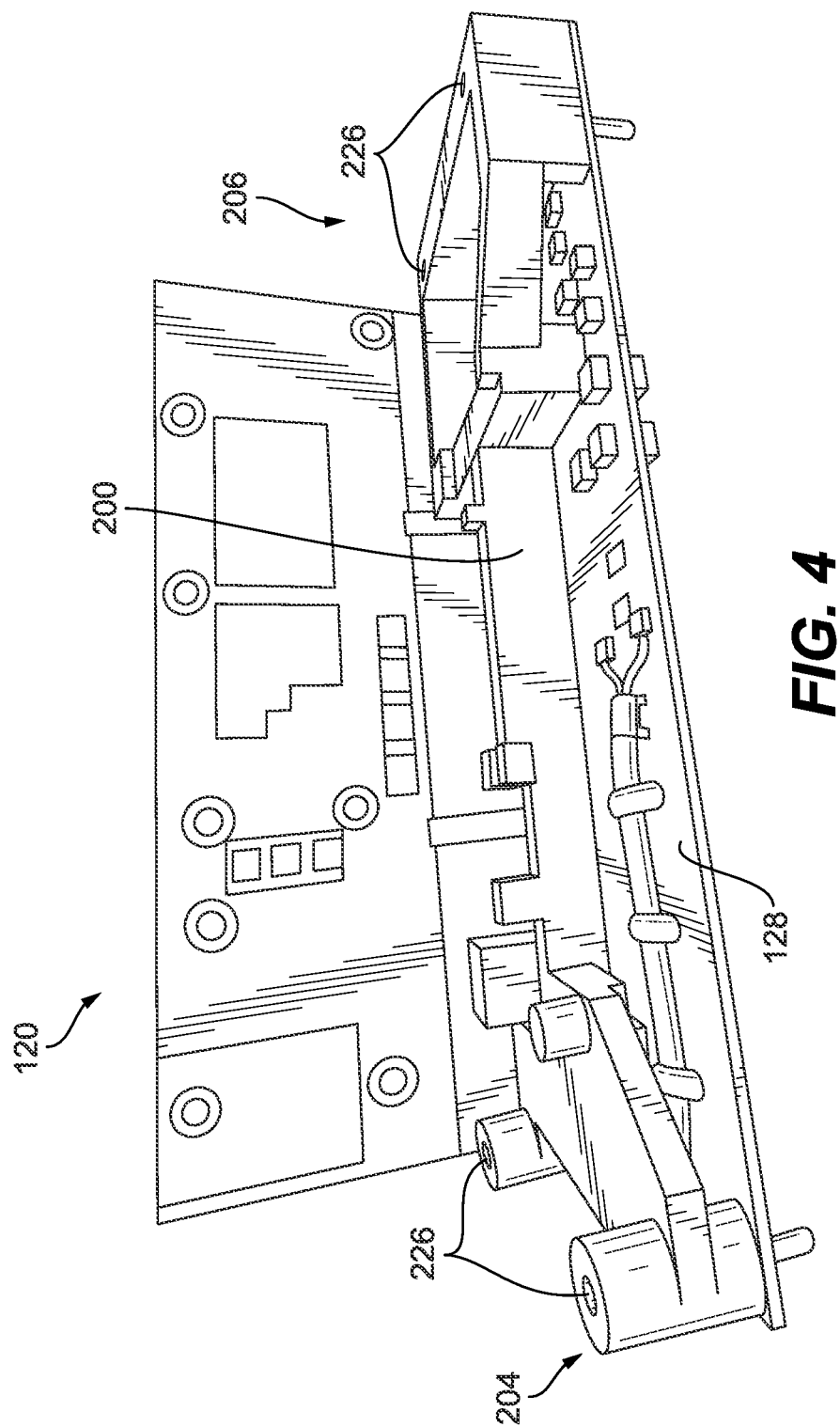
FIG. 4 is a schematic perspective view an embodiment of the shock resistant body of FIG. 1 mounted to an electronics component.
Figure 5:
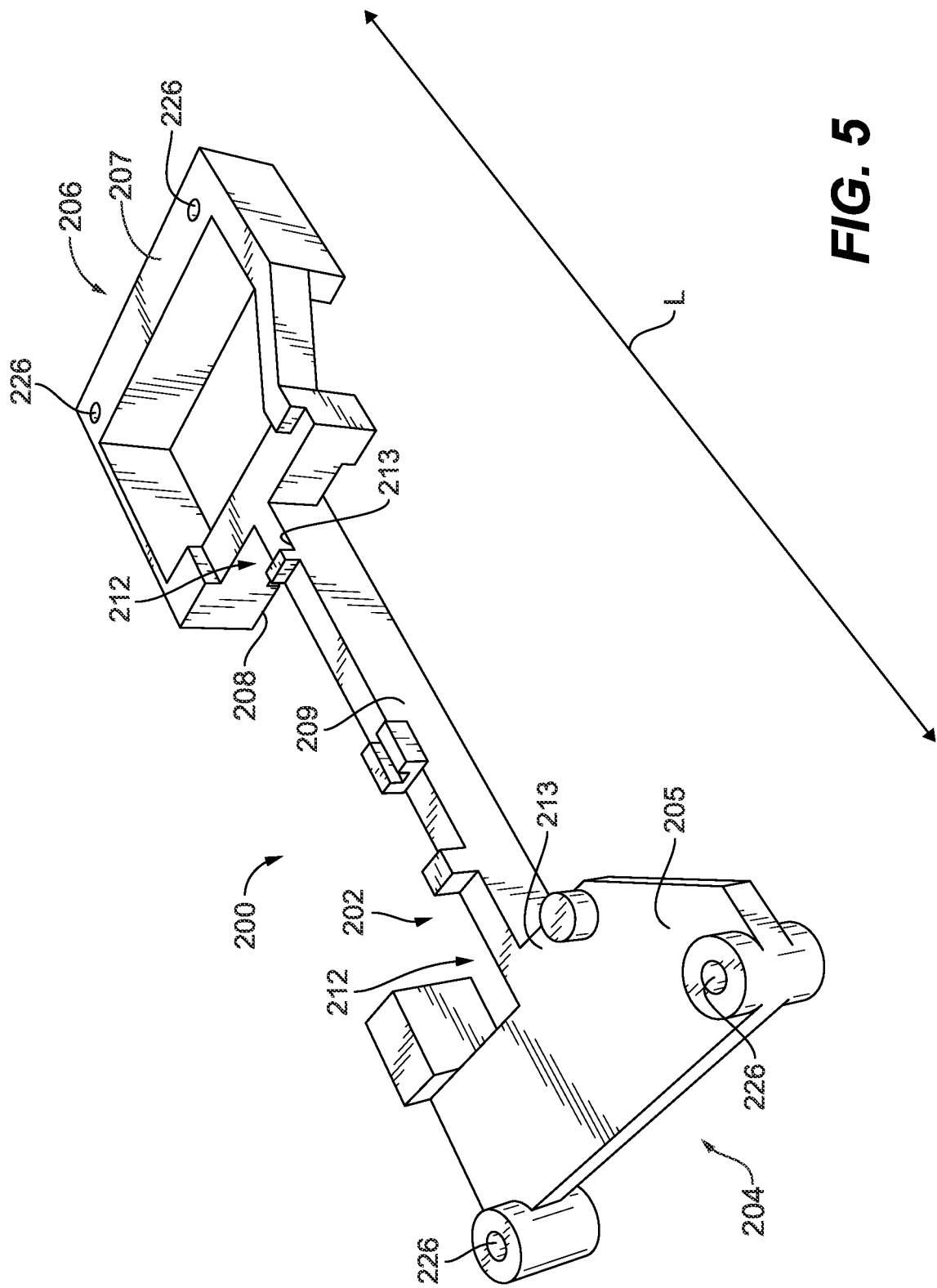
FIG. 5 is a schematic perspective view the embodiment of the shock resistant body of FIG. 5.

In accordance with another aspect of this disclosure, in certain embodiments, such as shown in FIGS. 3-5, the electronics cabinet 122 can be configured to house a plurality of flex boards 128. In this case, the body 100 can be or can include an electronics card spacer 200 (such as described in U.S. Pat. No. 10,973,125 issued Apr. 6, 2021, the entire content of which is incorporated herein by reference) configured to assemble to a respective flex board 128 to provide stiffness to and minimize flexure of the flex board 128 (e.g. as shown in FIG. 4). The electronics card spacer 200 can include a spacer body 202 having a first portion 204 with a first foam density 205, a second portion 206 having a second foam density 207 and bridge 208 having a third foam density 209, the bridge 208 connecting between the first portion 204 and the second portion 206.

In this application, the first and second end regions 204, 206 do not need to provide as much support to the flex board 128 as the bridge portion 208, for example. Therefore, the first and second portions 204, 206 can have a lesser foam density that the bridge portion 208 (e.g. the first and second portions 204, 206 having lattice members with smaller cross sections and larger interstices), allowing for optimal shock absorption while minimizing weight of the spacer 200. The bridge 208 may be additively manufactured using the same or similar processes as the first and second portions 204, 206, including having a foam density, or the bridge 208 may be additively manufactured using any conventional process that does not utilize lattice structure. At least one transition region 212 having a fourth foam density 213 is defined between the first portion 204 and the bridge 208 and between the bridge 208 and the second portion 206. The bridge 208 can have the greatest foam density, followed by the transition regions 212, then the first and second portions 204, 206. At each juncture, the transition region forms a density gradient between the respective foam densities therein along an axial length L of the electronics card spacer 200.

In certain embodiments, the first portion 204, second portion 206, and bridge 208 can form a single continuous monolithic, integral structure (e.g. as shown). In certain embodiments, a plurality of apertures 226 can be defined in at least one of the first portion 204 and/or second portion 206 configured to mount the electronics card spacer 200 to a respective flex board 128.

Figure 6:
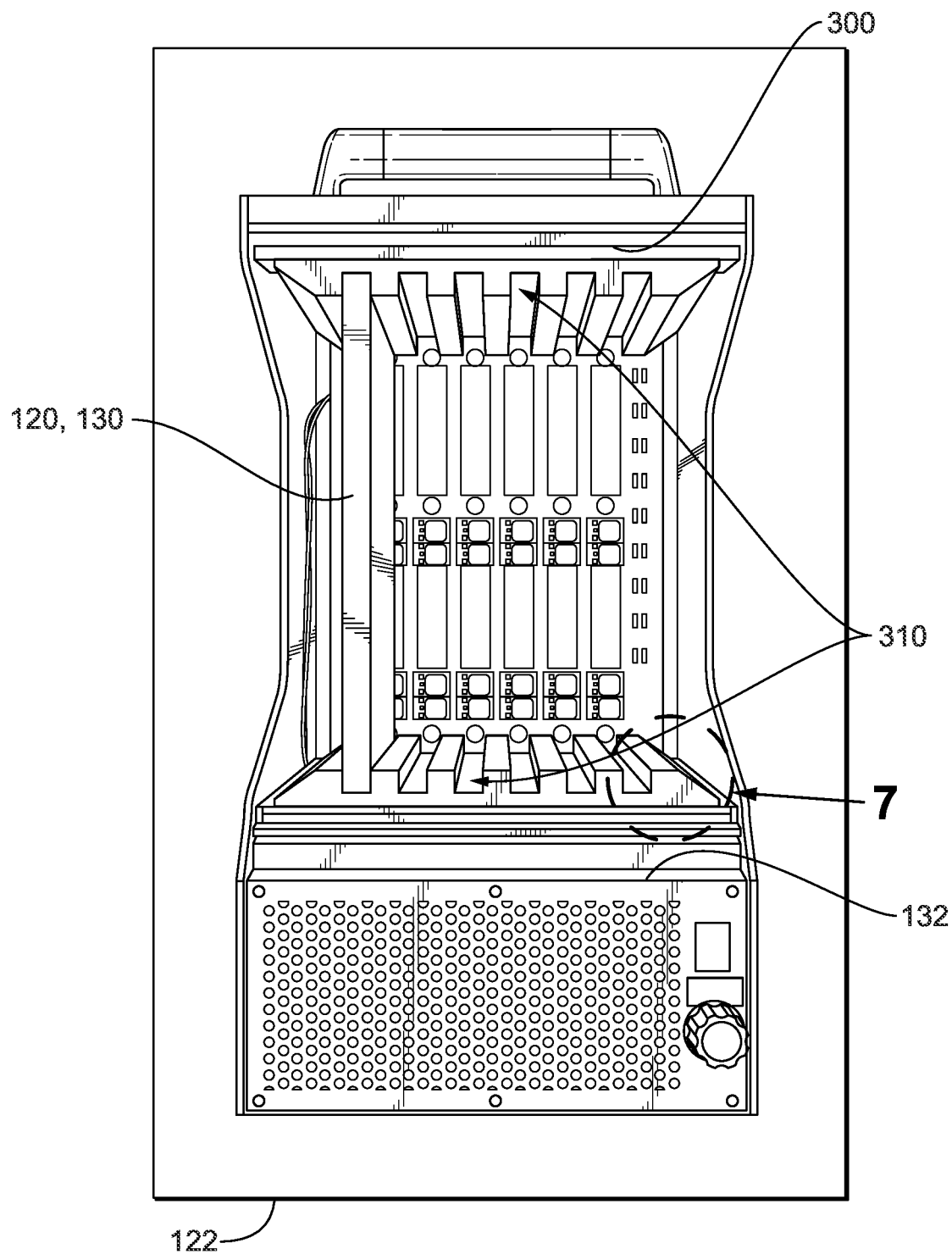
FIG. 6 is a schematic perspective view an embodiment of the shock resistant body of FIG. 1 disposed in an electronics chassis.
Figure 7:
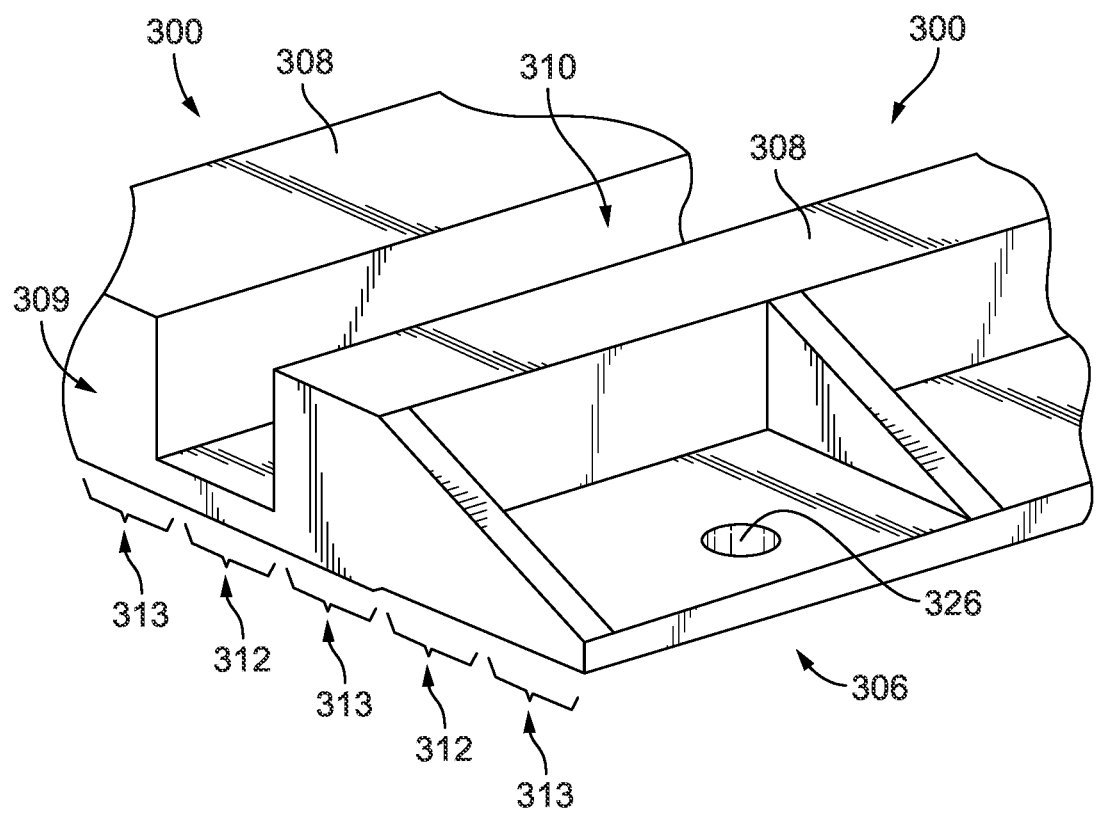
FIG. 7 is an enlarged schematic perspective view of the embodiment of the shock resistant body of FIG. 6, showing a plurality of regions of the shock resistant body.

In accordance with another aspect of this disclosure, in certain embodiments, such as shown in FIGS. 6-7, the body 100 can include an additively manufactured electronics card guide 300 configured to retain a plurality of electronics cards 130 in an electronics chassis 132. The electronics card guide 300 can include a first end region 304 having a first foam density 305, a second end region 306 having a second foam density 307, a plurality of spacer regions 308 having a third foam density 309, the spacer regions 308 being between the first and second end regions 304, 306, a plurality of electronics card slots 310 having a fourth foam density 311, the electronics card slots 310 being between the first and second end regions 304, 306 and alternating with the spacer regions 308 along a length L of the electronics card guide 300, and a plurality of transition regions 312 having a fifth foam density 313.

The foam density of the electronics card slots 310 can be greatest (e.g. having lattice members with the larges cross section and smallest interstices), followed by the foam density in the transition regions 312, then the spacer regions 308, the first end region 304, and the second end region 306. The first end region 304, second end region 306, and spacer regions 308 require less stiffness, than the electronics card slots 310 and therefore can have a lower foam density, reducing the weight of the card guide overall. The first end region 304, second end region 306, and spacer regions 308 can all have the same foam densities or can have different foam densities, depending on the application. In each case, their respective foam densities should be less than that of the electronics card slots 310 and transition regions 312.

The foam density within each respective region can remain constant within that respective region. The foam density of the transition region 312 can vary as the card guide is manufactures, for example, at each juncture, the transition region 312 forms a density gradient between the respective foam densities therein along the axial length L of the electronics card guide 300. In certain embodiments, the first region 304, the second region 306, the spacer regions 308, the electronics card slots 310, and the transition regions 312 can form a single continuous monolithic, integral structure.

A plurality of apertures 326 can be defined in at least one of the first end region 304, the second end region 306 and/or the spacer regions 308 configured to mount the card guide 300 to the chassis 132, or to the electronics cabinet 122, to provide shock absorption to electronics cards 130 seated within the electronics cards slots 310 within the electronics chassis 132 and/or cabinet 122.

The methods and systems of the present disclosure, as described above and shown in the drawings, provide for corrosion resistant support structures having custom compression deflection values and potentially optimized topology, as well as customized geometries to fit in each application. The systems and method provided herein additionally provide for reduced weight with increased compression strength and reduced cost, time, and complexity of manufacture. While the apparatus and methods of the subject disclosure have been shown and described, those skilled in the art will readily appreciate that changes and/or modifications may be made thereto without departing from the scope of the subject disclosure.

What is claimed is:

1. A shock resistant body comprising:
   a non-metallic lattice structure having a first foam density in a first region and a second foam density in a second region that is lower than the first foam density; wherein the first region comprises a constant foam density, wherein the second region comprises a constant foam density, and
   a transition region between the first and second regions, wherein the transition region has a foam density that transitions from the first foam density to the second foam density in a direction from the first region to the second region forming a density gradient.

2. The body as recited in claim 1, wherein the first region has solid lattice members of a larger cross-sectional area than solid lattice members in the second region.

3. The body as recited in claim 1, wherein the first region has smaller interstices between solid lattice members than between solid lattice members in the second region.

4. The body as recited in claim 1, wherein the first region has solid lattice members of a larger cross-sectional area than solid lattice members in the second region, and wherein the first region has smaller interstices between solid lattice members than between solid lattice members in the second region.

5. The body as recited in claim 1, wherein the first region and the second region are among a plurality of regions, wherein the lattice structure comprises a continuously variable foam density across the plurality of regions.

6. The body as recited in claim 1, wherein the non-metallic lattice structure is a product by process, wherein the process includes one or more processes selected from the list consisting of material extrusion, fused filament fabrication, fused deposition modeling, selective laser sintering, multi-jet fusion, vat polymerization, stereolithography, digital light synthesis, and material jetting.

7. The body as recited in claim 1, wherein the body is sized to accommodate a plurality of cooling fans in an electronics cabinet.

* * * * *